(12) United States Patent
Lin et al.

(10) Patent No.: US 10,608,533 B2
(45) Date of Patent: Mar. 31, 2020

(54) TIME MULTIPLEXING CIRCUIT APPLIED TO DC-DC CONVERTING SYSTEM

(71) Applicant: Raydium Semiconductor Corporation, Hsinchu (TW)

(72) Inventors: Shen-Xiang Lin, Taipei (TW); Hsuan-Hao Chien, Taipei (TW); Chih-Jen Hung, Taipei (TW)

(73) Assignee: Raydium Semiconductor Corporation, Hsinchu County (TW)

( * ) Notice: Subject to any disclaimer, the term of this patent is extended or adjusted under 35 U.S.C. 154(b) by 0 days.

(21) Appl. No.: 16/412,666

(22) Filed: May 15, 2019

(65) Prior Publication Data
US 2019/0356226 A1 Nov. 21, 2019

Related U.S. Application Data

(60) Provisional application No. 62/674,324, filed on May 21, 2018.

(51) Int. Cl.
*H02M 3/157* (2006.01)
*H03K 19/20* (2006.01)
*H02M 3/158* (2006.01)
*G09G 5/00* (2006.01)

(52) U.S. Cl.
CPC ......... *H02M 3/157* (2013.01); *H02M 3/1582* (2013.01); *H03K 19/20* (2013.01); *G09G 5/003* (2013.01); *G09G 2330/021* (2013.01)

(58) Field of Classification Search
CPC .................................................... H02M 3/157
See application file for complete search history.

(56) References Cited

U.S. PATENT DOCUMENTS

| 2018/0301998 | A1* | 10/2018 | Fogel | H02M 3/33561 |
| 2019/0052166 | A1* | 2/2019 | Ali | H02M 1/12 |
| 2019/0149141 | A1* | 5/2019 | Hsieh | H03K 7/08 327/116 |
| 2019/0190369 | A1* | 6/2019 | Nakamori | H02M 1/32 |
| 2019/0210481 | A1* | 7/2019 | Ishida | B60L 53/16 |
| 2019/0244880 | A1* | 8/2019 | Sun | G06F 1/22 |

* cited by examiner

*Primary Examiner* — Kyle J Moody
*Assistant Examiner* — Trinh Q Dang

(57) ABSTRACT

A time multiplexing circuit applied to a DC-DC converting system including first to third NOR gates, first and second inverters, first and second D-type flip-flops, a NAND gate, an OR gate and an AND gate. The first NOR gate and second NOR gate receive the first and second pulse-width modulation signals respectively and output a boost state request signal and a buck-boost state request signal respectively. The first D-type flip-flop outputs a first time multiplex output signal and a first reverse time multiplex output signal. The second D-type flip-flop outputs a second time multiplex output signal and a second reverse time multiplex output signal. The third NOR gate outputs another first time multiplex output signal. The NAND gate outputs another second time multiplex output signal. The OR gate outputs a first reverse output signal. The AND gate outputs a second reverse output signal.

15 Claims, 10 Drawing Sheets

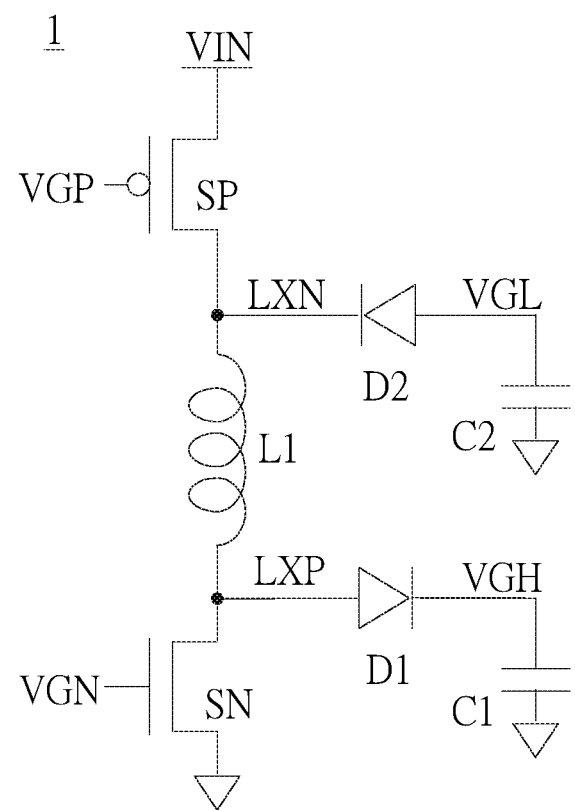
【FIG.1 (PRIOR ART)】

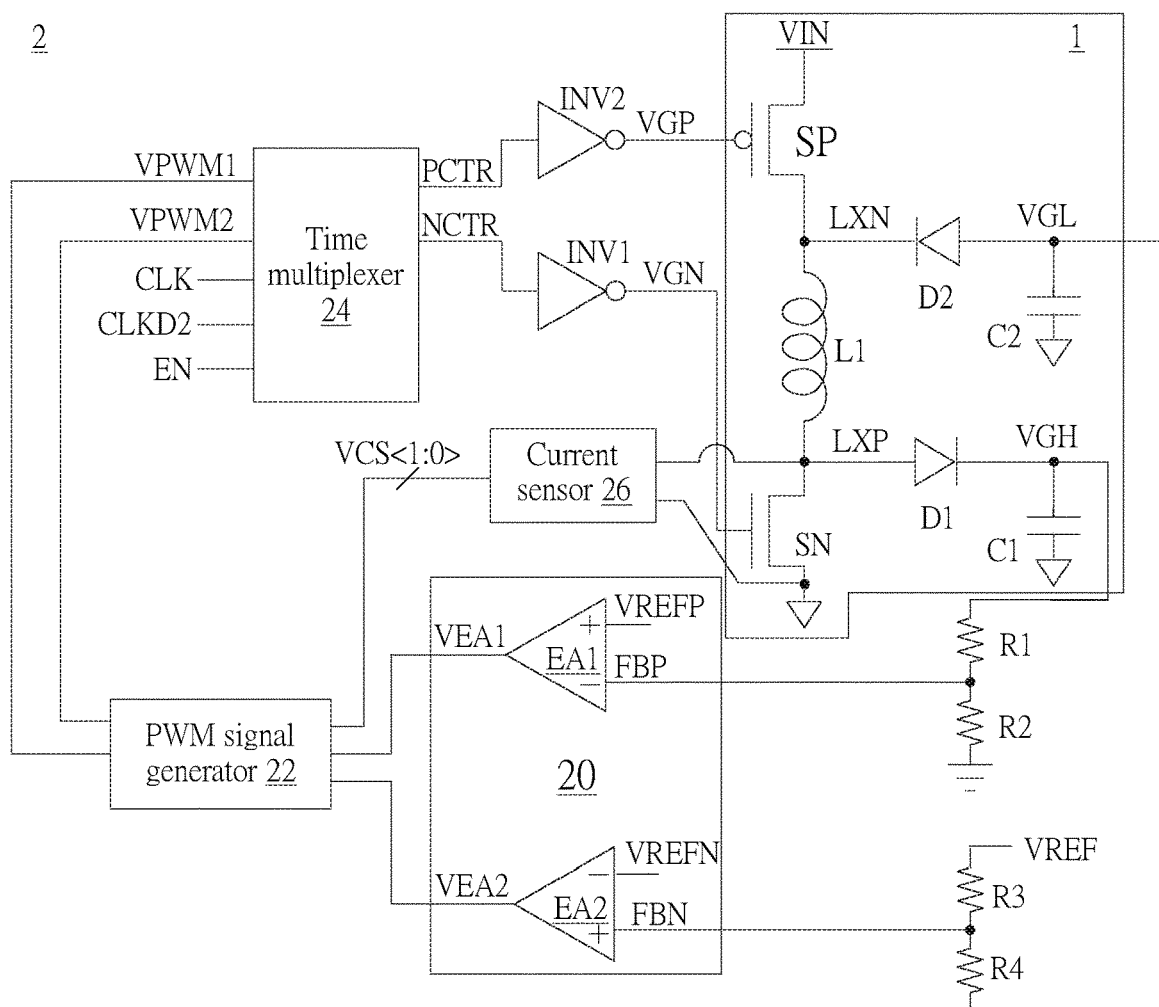
【FIG.2 (PRIOR ART)】
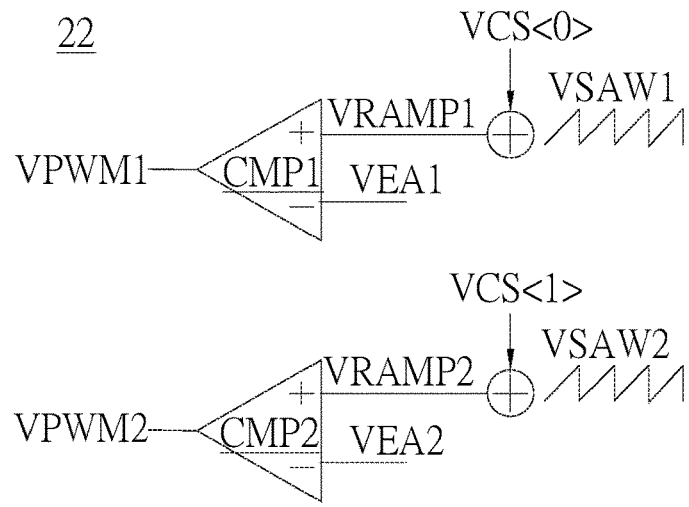
【FIG.3 (PRIOR ART)】

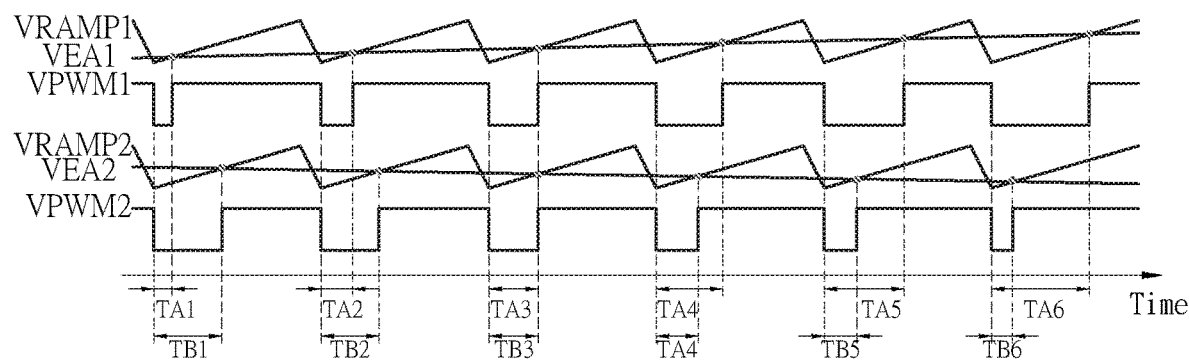
【FIG.4 (PRIOR ART)】

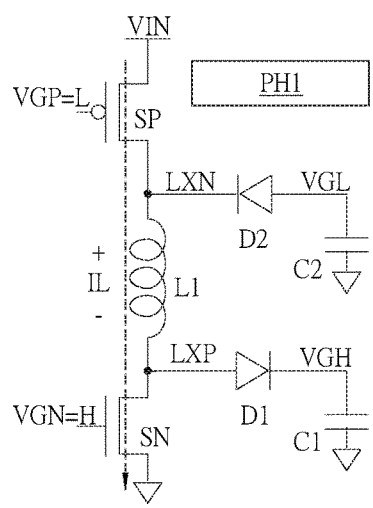
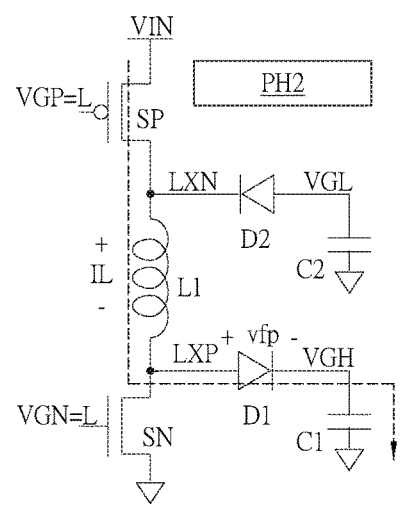
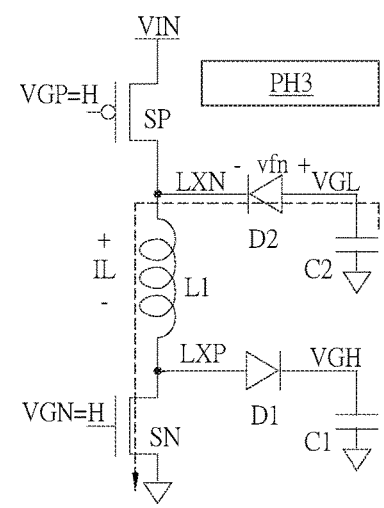
【FIG.5A (PRIOR ART)】　　【FIG.5B (PRIOR ART)】　　【FIG.5C (PRIOR ART)】

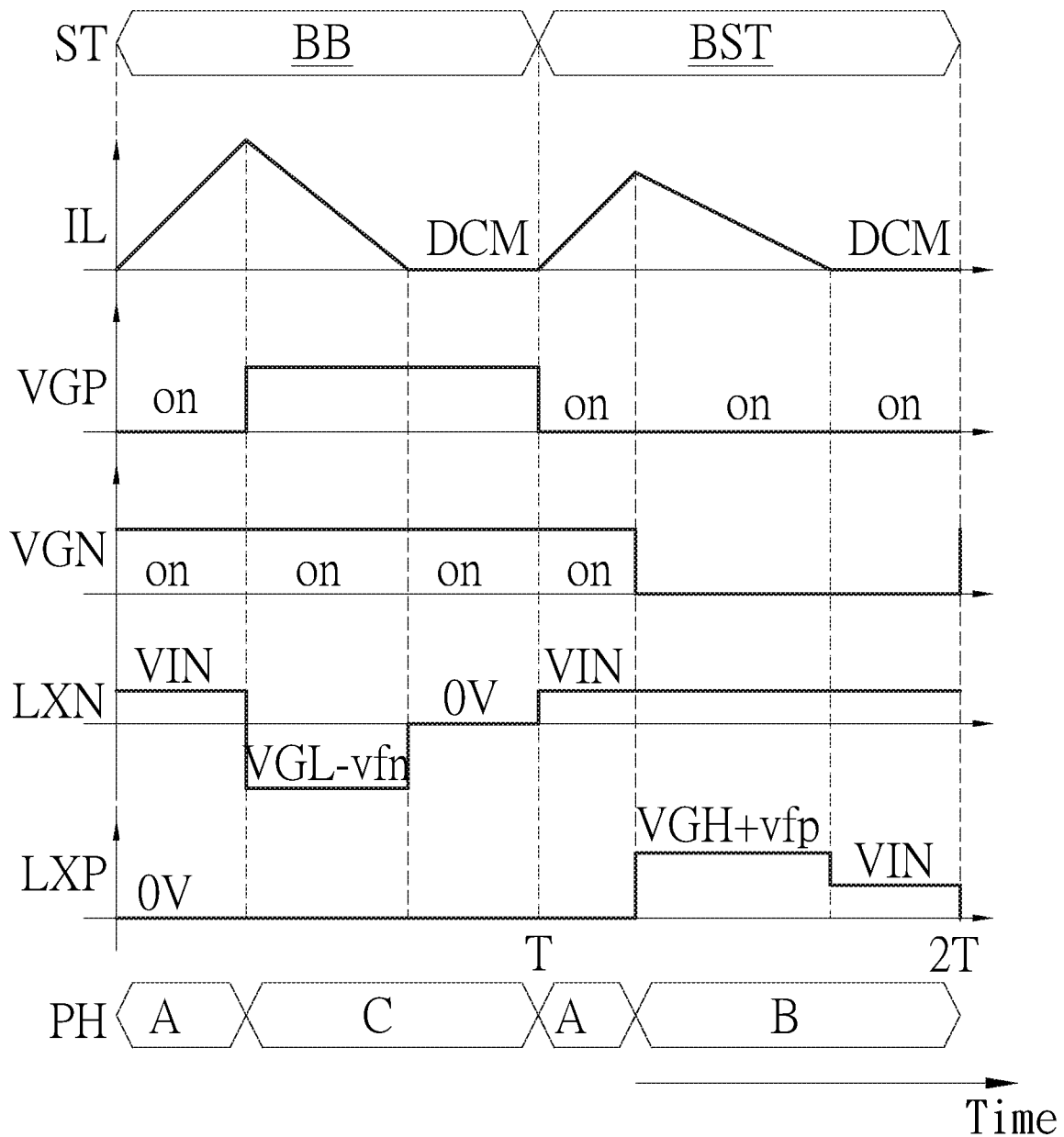
【FIG.6 (PRIOR ART)】

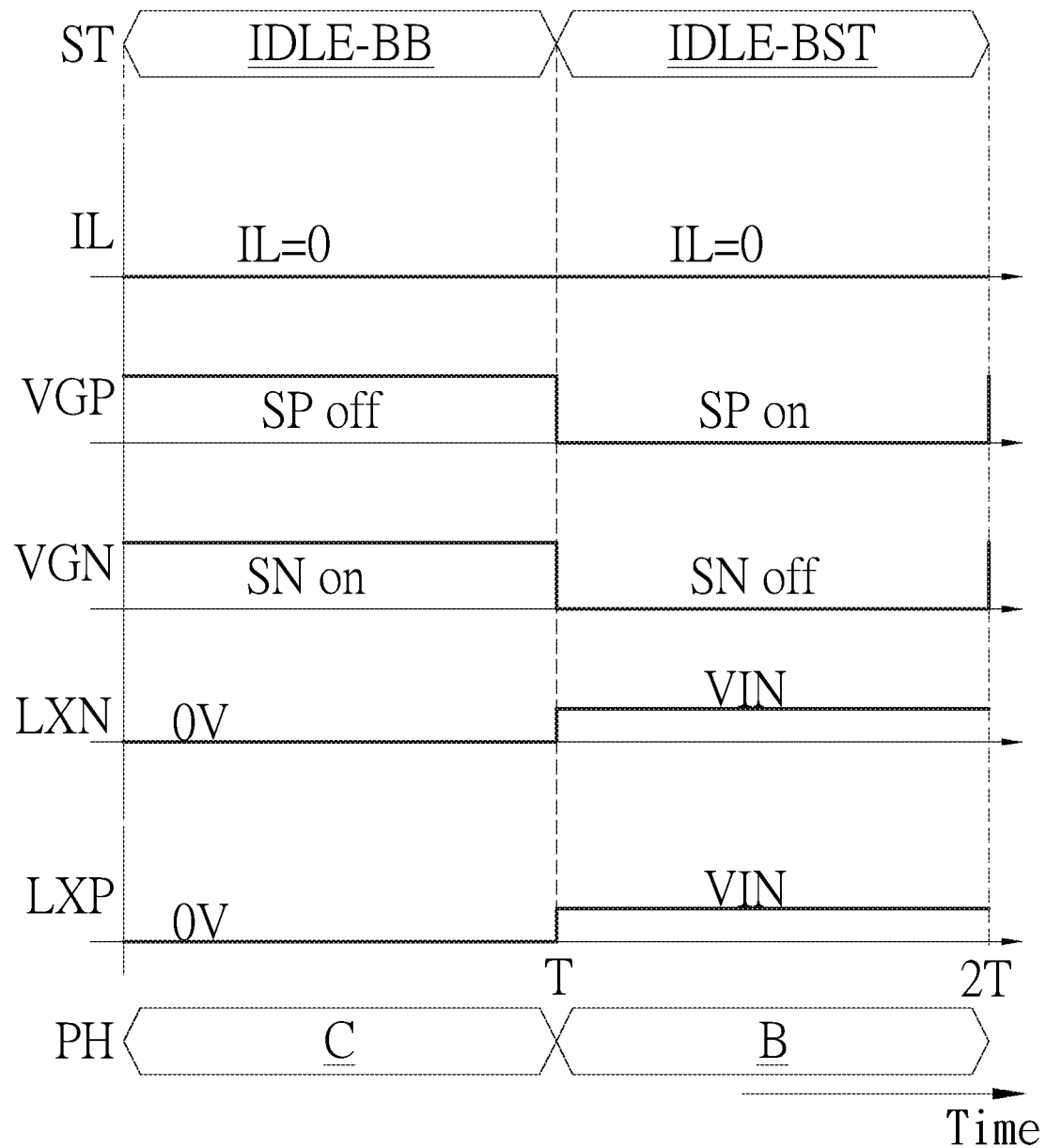
【FIG.7 (PRIOR ART)】

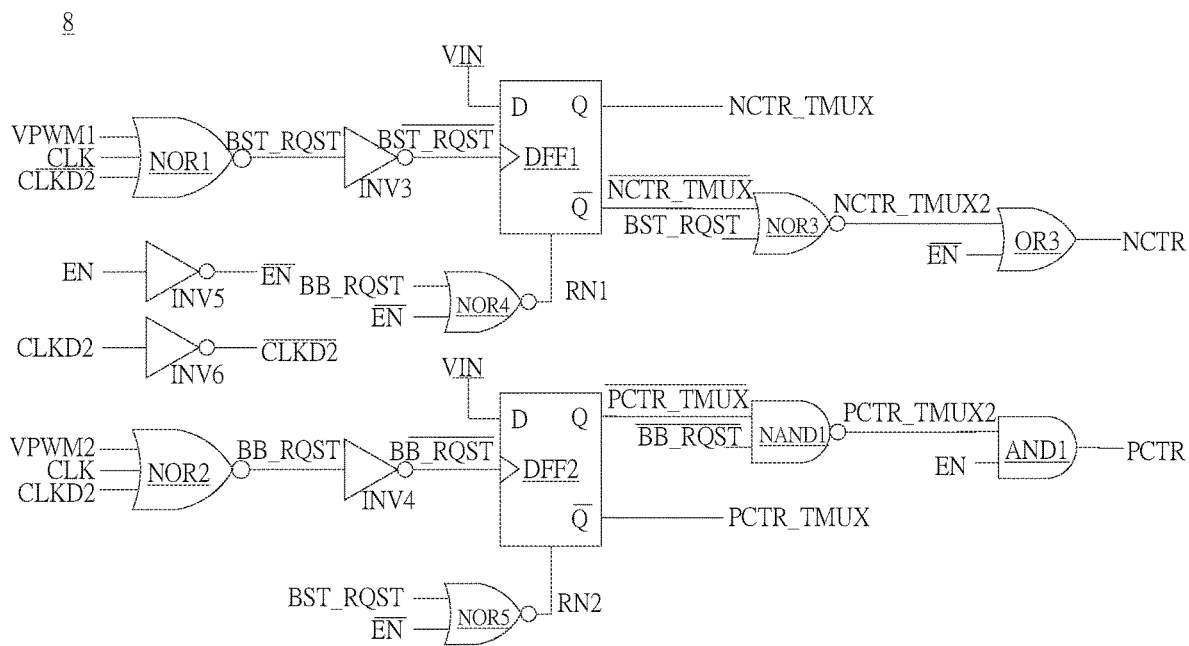
[FIG.8]

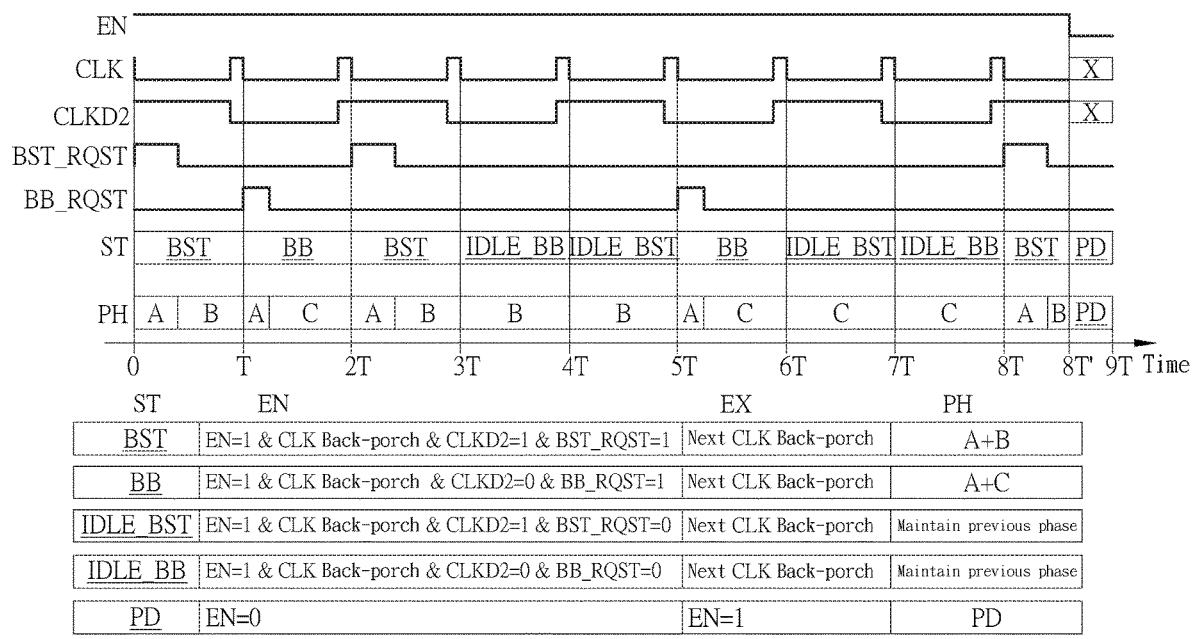
[FIG.9]

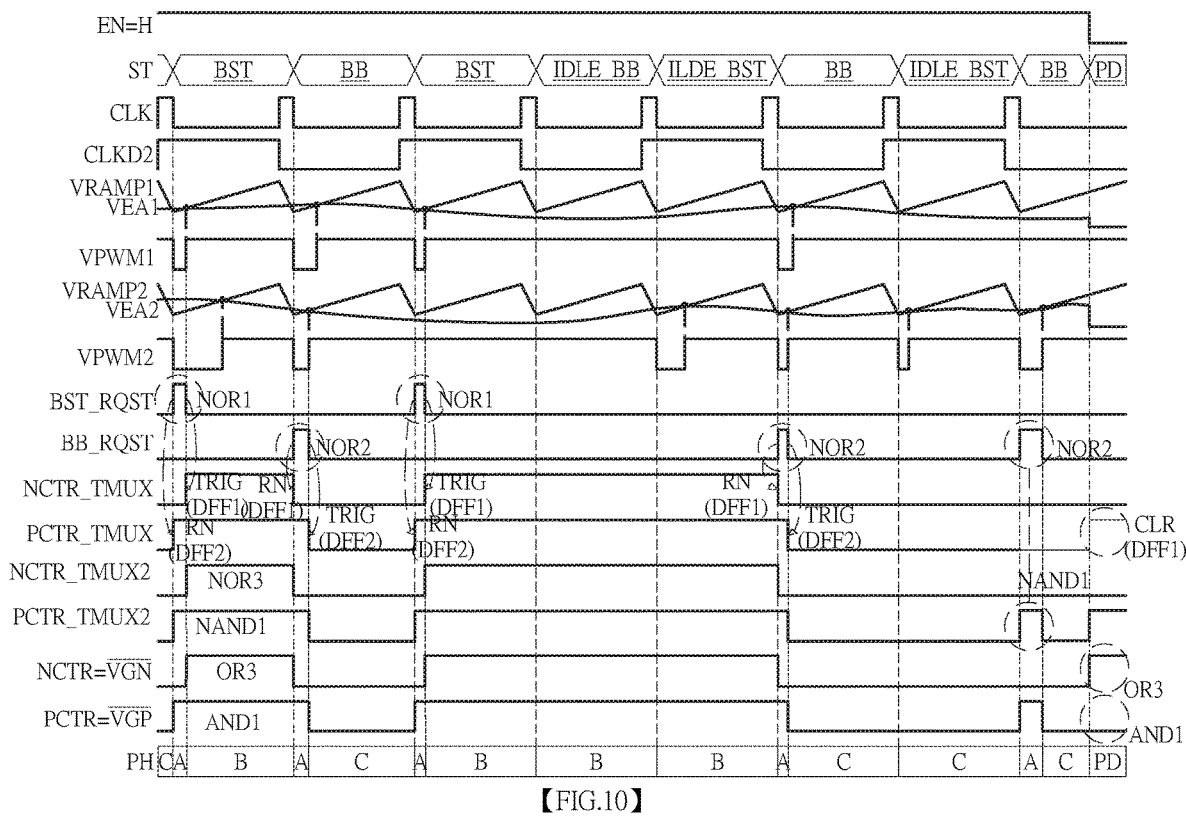
【FIG.10】

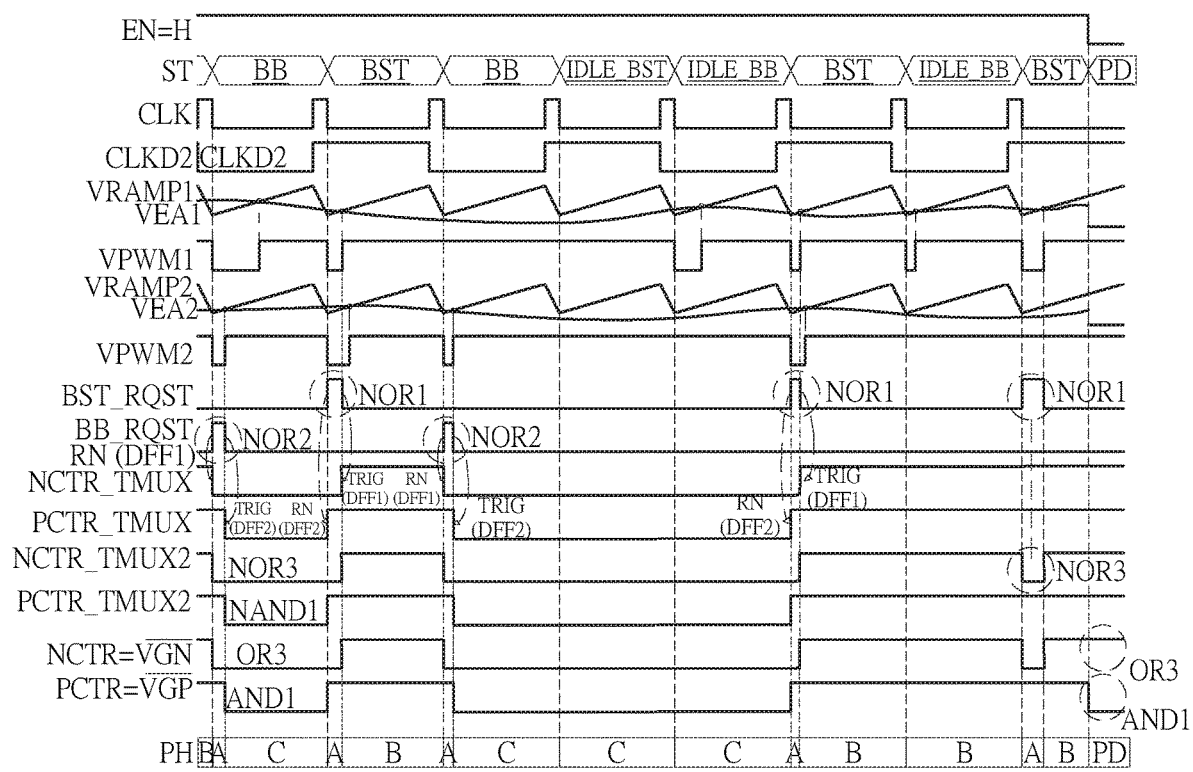
[FIG.11]

TIME MULTIPLEXING CIRCUIT APPLIED TO DC-DC CONVERTING SYSTEM

BACKGROUND OF THE INVENTION

1. Field of the Invention

The invention relates to a display; in particular, to a time multiplexing circuit applied to a DC-DC converting system suitable for power management of a display driver in a display.

2. Description of the Prior Art

Conventionally, the power supply of a gate driver (including a high-level output voltage VGH and a low-level output voltage VGL) in a liquid crystal display is provided by a boost DC-DC converter and a buck-boost DC-DC converter respectively. Among them, the high-level output voltage VGH is a positive output voltage generated by the boost DC-DC converter, and the low-level output voltage is a negative output voltage generated by the buck-boost DC-DC converter.

As shown in FIG. 1, in order to reduce cost, the boost DC-DC converter and the buck-boost DC-DC converter can be combined into a single-inductor dual-output (SIDO) DC-DC converter 1 sharing the same inductor L1. The SIDO DC-DC converter 1 can include a P-type transistor SP, an N-type transistor SN, a boost rectifier diode D1, a boost-boost rectifier diode D2, an output capacitor C1 corresponding to a high-level output voltage VGH, an output capacitor C2 corresponding to a low-level output voltage VGL and an inductor L1.

As shown in FIG. 2, the SIDO DC-DC converting system 2 can include a SIDO DC-DC converter, error amplifiers EA1~EA2, voltage dividing resistors R1~R4, a pulse-width modulation (PWM) signal generator 22, a time multiplexer 24, a current sensor 26 and inverters INV1~INV2.

The error amplifier EA1 receives a reference voltage VREFP and a feedback signal FBP, and the feedback signal FBP is obtained by dividing the high-level output voltage VGH by the voltage dividing resistors R1~R2. The error amplifier EA2 receives a reference voltage VREFN and a feedback signal FBN, and the feedback signal FBN is obtained by dividing the voltage difference between the reference voltage VREF and the low-level output voltage VGL by the voltage dividing resistors R3~R4. The current sensor 26 is used to sense the current flowing through the N-type transistor SN and generate a current sensing signal VCS<1:0>. The current sense signal VCS<1:0> includes a current sense signal VCS<1> and a current sense signal VCS<0>.

The PWM signal generator 22 receives an error amplification signal VEA1 outputted by the error amplifier EA1, an error amplification signal VEA2 outputted by the error amplifier EA2 and the current sensing signal VCS<1:0> outputted by the current sensor 26 respectively and generates PWM signals VPWM1~VPWM2 to the time multiplexer 24 accordingly.

The time multiplexer 24 receives an enable signal EN, a clock signal CLK, a ½ clock signal CLKD2 and the PWM signals VPWM1~VPWM2 respectively, and generates reverse output signals PCTR and NCTR to the inverters INV1~INV2 respectively. When the inverters INV1~INV2 receive the reverse output signals PCTR and NCTR respectively, the inverters INV1~INV2 invert the reverse output signals PCTR and NCTR respectively to generate the switch control signals VGP and VGN to the P-type transistor SP and the N-type transistor SN in the SIDO DC-DC converter 1 to control the operation timing of the P-type transistor SP and the N-type transistor SN.

As shown in FIG. 3, in order to avoid the occurrence of subharmonic oscillation, the PWM signal generator 22 can add sawtooth waves VSAW1 and VSAW2 into the current sensing signals VCS<0> and VCS<1> through the adder to perform slope compensation to form ramp signals VRAMP1 and VRAMP2.

The positive input terminal + and the negative input terminal − of the comparator CMP1 receive the ramp signal VRAMP1 and the error amplification signal VEA1 respectively to generate a PWM signal VPWM1, and the timing diagram thereof is shown in FIG. 4. The positive input terminal + and the negative input terminal − of the comparator CMP2 receive the ramp signal VRAMP2 and the error amplification signal VEA2 respectively, and generate a PWM signal VPWM2, and the timing diagram thereof is shown in FIG. 4.

Please refer FIG. 5A to FIG. 5C. The operating phases of the SIDO DC-DC converter include the following three phases: as shown in FIG. 5A, the first phase PH1 is a phase of storing energy in the inductor; as shown in FIG. 5B, the second phase PH2 is a phase of charging the output capacitor C1 corresponding to the high-level output voltage VGH; the third phase PH3 is a phase of discharging the output capacitor C2 corresponding to the low-level output voltage VGL.

Generally, the SIDO DC-DC converter needs to adopt a time division multiplexing control method, so that the buck-boost state BB and the boost state BST can be sequentially operated in a discontinuous conduction mode (DCM); that is, at the beginning of each period, for example, at the times 0, T, and 2T, the inductor current IL needs to start from zero current. Please refer to FIG. 6 for the timing diagram.

As shown in FIG. 6, if the boost state BST is formed by the first phase PH A and the second phase PH B and the buck-boost state BB is formed by the first phase PH A and the third phase PH C, during the first phase PH A, the inductor L will store energy, so that the inductor current IL will increase with time; during the second phase PH B, the output capacitor C1 will be charged; during the third phase PH C, the output capacitor C2 will be discharged.

As shown in FIG. 7, when the high-level output voltage VGH or the low-level output voltage VGL reaches the target value, the system will enter into the boost idle state IDLE-BST and the buck-boost idle state IDLE-BB respectively. At this time, since the voltage is sufficient, the inductor L does not need to store energy any more, that is to say, it does not need to enter into the first phase PH A, so that only the second phase PH B will be entered in the boost idle state IDLE-BST, and only the third phase PH C will be entered in the buck-boost idle state IDLE-BB.

However, regardless of the boost idle state IDLE-BST or the buck-boost idle state IDLE-BB, the switch control signals VGP and VGN will still operate, resulting in unnecessary power consumption and failing to achieve good power saving effect. It is urgent to overcome.

SUMMARY OF THE INVENTION

Therefore, the invention provides a time multiplexing circuit applied to a DC-DC converting system to solve the above-mentioned problems of the prior arts.

A preferred embodiment of the invention is a time multiplexing circuit applied to a DC-DC converting system. In this embodiment, the time multiplexing circuit is use for receiving a first pulse-width modulation signal and a second pulse-width modulation signal and outputting a first reverse output signal and a second reverse output signal. The time multiplexing circuit includes a first NOR gate, a second NOR gate, a first inverter, a second inverter, a first D-type flip-flop, a second D-type flip-flop, a third NOR gate, a NOR gate, an OR gate and an AND gate. The first NOR gate is configured to receive the first pulse-width modulation signal, a clock signal and a reverse clock related signal and output a boost state request signal. The second NOR gate is configured to receive the second pulse-width modulation signal, the clock signal and a clock related signal and output a buck-boost state request signal. The first inverter is coupled to the first NOR gate and configured to convert the boost state request signal into a reverse boost state request signal. The second inverter is coupled to the second NOR gate and configured to convert the buck-boost state request signal into a reverse buck-boost state request signal. The first D-type flip-flop is coupled to the first inverter and configured to receive the reverse boost state request signal and an input voltage and output a first time multiplex output signal and a first reverse time multiplex output signal respectively. The second D-type flip-flop is coupled to the second inverter and configured to receive the reverse buck-boost state request signal and the input voltage and output a second time multiplex output signal and a second reverse time multiplex output signal respectively. The third NOR gate is coupled to the first D-type flip-flop and configured to receive the first reverse time multiplex output signal and the boost state request signal and output another first time multiplex output signal. The NOR gate is coupled to the second D-type flip-flop and configured to receive the second reverse time multiplex output signal and the reverse buck-boost state request signal and output another second time multiplex output signal. The OR gate is coupled to the third NOR gate and configured to receive the another first time multiplex output signal and a reverse enable signal and output the first reverse output signal. The AND gate is coupled to the NOR gate and configured to receive the another second time multiplex output signal and an enable signal and output the second reverse output signal.

In an embodiment, the DC-DC converting system is a single-inductor dual-output (SIDO) DC-DC converting system used for outputting a high-level output voltage and a low-level output voltage, wherein the high-level output voltage is a positive voltage and the low-level output voltage is a negative voltage.

In an embodiment, the DC-DC converting system further comprises a single-inductor dual-output DC-DC converter, and the time multiplexing circuit is coupled to the single-inductor dual-output DC-DC converter through two inverters.

In an embodiment, the two inverters convert the first reverse output signal and the second reverse output signal outputted by the time multiplexing circuit into a first switch control signal and a second switch control signal and output the first switch control signal and the second switch control signal to the single-inductor dual-output DC-DC converter.

In an embodiment, the single-inductor dual-output DC-DC converter comprises a N-type transistor, a P-type transistor and an inductor, the P-type transistor is coupled between the input voltage and the inductor and the N-type transistor is coupled between the inductor and ground; a gate of the N-type transistor is controlled is controlled by the first switch control signal and a gate of the P-type transistor is controlled by the second switch control signal.

In an embodiment, when the boost state request signal is at high-level, the high-level output voltage does not reach a default value, and the DC-DC converting system enters into a first phase of a boost state.

In an embodiment, when the buck-boost state request signal is at high-level, the low-level output voltage does not reach a default value, and the DC-DC converting system enters into a first phase of a buck-boost state.

In an embodiment, the first time multiplex output signal outputted by the first D-type flip-flop is triggered by a back-porch of the boost state request signal to become high-level; when the enable signal is at low-level or the buck-boost state request signal is at high-level, the first time multiplex output signal is reset to low-level.

In an embodiment, the second time multiplex output signal outputted by the second D-type flip-flop is triggered by a back-porch of the buck-boost state request signal to become low-level; when the enable signal is at low-level or the boost state request signal is at high-level, the second time multiplex output signal is reset to high-level.

In an embodiment, the another first time multiplex output signal outputted by the third NOR gate is the first time multiplex output signal or a difference between the first time multiplex output signal and the boost state request signal.

In an embodiment, the another second time multiplex output signal outputted by the NAND gate is the first time multiplex output signal or the boost state request signal.

In an embodiment, the time multiplexing circuit has five operation states including: a first operation state being a boost state corresponding to the high-level output voltage; a second operation state being a buck-boost state corresponding to the low-level output voltage; a third operation state maintaining a previous operation state when the clock related signal is at high-level and the boost state request signal is at low-level; a fourth operation state maintaining the previous operation state when the clock related signal is at low-level and the buck-boost state request signal is at low-level; and a fifth operation state being a power down state.

In an embodiment, the clock related signal is half of the clock signal.

In an embodiment, the reverse clock related signal is half of a reverse signal of the clock signal.

In an embodiment, the reverse enable signal is a reverse signal of the enable signal.

Compared to the prior art, the time multiplexing circuit applied to the DC-DC converting system proposed by the invention maintains the operation in the previous phase in the boost idle state or the buck-boost idle state, so as to avoid a change of the switch control signal in the boost idle state or the buck-boost idle state, so that unnecessary power consumption can be omitted, and a good power saving effect can be achieved, which can be applied to the power management of the display driver in the display.

The advantage and spirit of the invention may be understood by the following detailed descriptions together with the appended drawings.

BRIEF DESCRIPTION OF THE APPENDED DRAWINGS

FIG. 1 illustrates a schematic circuit diagram of a conventional single-inductor dual-output (SIDO) DC-DC converter.

FIG. 2 illustrates a schematic circuit diagram of a conventional SIDO DC-DC converting system.

FIG. 3 illustrates an embodiment of a pulse-width modulation (PWM) signal generator in FIG. 2.

FIG. 4 illustrates a timing diagram of generating a PWM signal according to a ramp signal and an error amplification signal.

FIG. 5A~FIG. 5C illustrate schematic diagrams of three operation phases of the SIDO DC-DC converter respectively.

FIG. 6 illustrates a timing diagram of the SIDO DC-DC converter using time division multiplexing control.

FIG. 7 illustrates a timing diagram showing the switch control signal still operates under the boost idle state or the buck-boost idle state.

FIG. 8 illustrates a schematic diagram of a time multiplexing circuit applied to the DC-DC converting system in an embodiment of the invention.

The upper half of FIG. 9 illustrates a timing diagram showing the signals of the time multiplexing circuit operating in different operating states; the lower half of FIG. 9 illustrates schematic diagrams of start conditions, end conditions and operation phases corresponding to the five operation states of the time multiplexing circuit.

FIG. 10 illustrates a timing diagram showing signals in a time multiplexing circuit operating in different operating states.

FIG. 11 illustrates a timing diagram showing signals in a time multiplexing circuit operating in different operating states.

DETAILED DESCRIPTION OF THE INVENTION

A preferred embodiment of the invention is a time multiplexing circuit applied to a DC-DC converting system and used for receiving a first pulse-width modulation signal and a second pulse-width modulation signal and outputting a first reverse output signal and a second reverse output signal.

In fact, the DC-DC conversing system can be a single-inductor dual-output (SIDO) DC-DC converting system for outputting a high-level output voltage (VGH) and a low-level output voltage (VGL), wherein the high-level output voltage (VGH) is a positive voltage and the low-level output voltage (VGL) is a negative voltage, but not limited to this.

Please refer to FIG. 8. FIG. 8 illustrates a schematic diagram showing a time multiplexing circuit applied to a DC-DC converting system in this embodiment.

As shown in FIG. 8, the time multiplexing circuit 8 includes a first NOR gate NOR1 to a fifth NOR gate NOR5, a first inverter INV3 to a second inverter INV4, a first D-type flip-flop DFF1 to a second D-type flip-flop DFF2, a NAND gate NAND1, an OR gate OR3 and an AND gate AND1.

The first NOR gate NOR1 is coupled to the first inverter INV3; the first inverter INV3 is coupled to the first D-type flip-flop DFF1; the fourth NOR gate NOR4 is coupled to the first D-type flip-flop DFF1; the first D-type flip-flop DFF1 is coupled to the third NOR gate NOR3; the third NOR gate NOR3 is coupled to the OR gate OR3; the second NOR gate NOR2 is coupled to the second inverter INV4; the second inverter INV4 is coupled to the second D-type flip-flop DFF2; the fifth NOR gate NOR5 is coupled to the second D-type flip-flop DFF2; the second D-type flip-flop DFF2 is coupled to the NAND gate NAND1; the NAND gate NAND1 is coupled to the AND gate AND1.

The first NOR gate NOR1 is configured to receive the first pulse-width modulation (PWM) signal VPWM1, the clock signal CLK and the reverse clock related signal $\overline{CLKD2}$ and output the boost state request signal BST_RQST. It should be noted that the reverse clock related signal $\overline{CLKD2}$ is one-half of the reverse signal of the clock signal CLK, but not limited to this.

The second NOR gate NOR2 is configured to receive the second PWM signal VPWM2, the clock signal CLK and the pulse related signal CLKD2, and output the down boost state request signal BB_RQST. It should be noted that the clock related signal CLKD2 is one-half of the clock signal CLK, but not limited to this.

The first inverter INV3 is configured to convert the boost state request signal BST_RQST into a reverse boost state request signal $\underline{BST\_RQST}$. The second inverter INV4 is configured to convert the buck-boost state request signal BB_RQST into a reverse buck-boost state request signal $\underline{BB\_RQST}$.

The first D-type flip-flop DFF1 is configured to receive the reverse boost state request signal $\underline{BST\_RQST}$ and the input voltage VIN and output the first time multiplex output signal NCTR_TMUX and the first reverse time multiplex output signal $\underline{NCTR\_TMUX}$ respectively.

In addition, the first D-type flip-flop DFF1 further receives the input signal RN1 provided by the fourth NOR gate NOR4, and the fourth NOR gate NOR4 receives the buck-boost state request signal BB_RQST and the reverse enable signal $\overline{EN}$ respectively, and accordingly generates the input signal RN1 to the first D-type flip-flop DFF1. It should be noted that the reverse enable signal $\overline{EN}$ is a reverse signal of the enable signal EN.

The second D-type flip-flop DFF2 is configured to receive the reverse buck-boost state request signal $\overline{BB\_RQST}$ and the input voltage VIN and output the second time multiplex output signal PCTR_TMUX and the second reverse time multiplex output signal $\overline{PCTR\_TMUX}$ respectively.

In addition, the second D-type flip-flop DFF2 also receives the input signal RN2 provided by the fifth NOR gate NOR5, and the fifth NOR gate NOR5 receives the boost state request signal BST_RQST and the reverse enable signal EN respectively, and accordingly generates the input signal RN2 to the second D-type flip-flop DFF2.

The third NOR gate NOR3 is configured to receive the first reverse time multiplex output signal $\overline{NCTR\_TMUX}$ and the boost state request signal BST_RQST and output another first time multiplex output signal NCTR_TMUX2.

The NAND gate NAND1 is configured to receive the second reverse time multiplex output signal $\overline{PCTR\_TMUX}$ and the reverse boost state request signal $\overline{BB\_RQST}$ and output another second time multiplex output signal PCTR_TMUX2.

The OR gate OR3 is configured to receive another first time multiplex output signal NCTR_TMUX2 and a reverse enable signal $\overline{EN}$ and output a first reverse output signal NCTR. The AND gate AND1 is configured to receive another second time multiplex output signal PCTR_TMUX2 and the enable signal EN and output a second reverse output signal PCTR.

In practical applications, the DC-DC converting system also includes a SIDO DC-DC converter. The time multiplexing circuit 8 can be coupled to the SIDO DC-DC converter (e.g., the SIDO DC-DC converter 1 in FIG. 2) through two inverters (e.g., the inverters INV1~INV2 in FIG. 2). The two inverters respectively convert the first reverse output signal and the second reverse output signal outputted by the time multiplexing circuit 8 into the first switch control signal VGN and the second switch control signal VGP, and then output the first switch control signal VGN and the second switch control signal VGP to the SIDO DC-DC converter.

As shown in FIG. 2, the SIDO DC-DC converter 1 can include an N-type transistor SN, a P-type transistor SP and an inductor L1. The P-type transistor SP is coupled between the input voltage VIN and the inductor L1 and the N-type transistor SN is coupled between the inductor L1 and ground. The gate of the N-type transistor SN is controlled by the first switch control signal VGN and the gate of the P-type transistor SP is controlled by the second switch control signal VGP.

When the boost state request signal BST_RQST is at high-level, it means that the high-level output voltage VGH does not reach a default value, and the DC-DC converting system will enter the first phase (PH A) in the boost state. When the buck-boost state request signal BB_RQST is at high-level, it means that the low-level output voltage VGL does not reach the default value, and the DC-DC converting system will enter the first phase (PH A) in the buck-boost state.

The first time multiplex output signal NCTR_TMUX outputted by the first D-type flip-flop DFF1 can be triggered by the back-porch of the boost state request signal BST_RQST to become high-level; when the enable signal EN is at low-level or the buck-boost state request signal BB_RQST is at high-level, that is when the input signal RN1 is at low-level, the first time multiplex output signal NCTR_TMUX will be reset to low-level.

The second time multiplex output signal PCTR_TMUX outputted by the second D-type flip-flop DFF2 can be triggered by the back-porch of the buck-boost state request signal BB_RQST to become low-level; when the enable signal EN is at low-level or the buck-boost state request signal BST_RQST is at high-level, that is when the input signal RN2 is at low-level, the second time multiplex output signal PCTR_TMUX will be reset to high-level.

Another second time multiplex output signal PCTR_TMUX2 outputted by the NAND gate NAND1 can be a first time multiplex output signal NCTR_TMUX or the buck-boost state request signal BB_RQST, as shown in FIG. 10 and its related description. Another first time multiplex output signal NCTR_TMUX2 outputted by the third NOR gate NOR3 can be the sum of the first time multiplex output signal NCTR_TMUX and the boost state request signal BST_RQST, as shown in FIG. 11 and related description.

It should be noted that, as shown in the lower half of FIG. 9, the time multiplexing circuit 8 of the invention can have five operational states ST including:

(1) a first operation state BST: a boost state corresponding to the high-level output voltage VGH;

(2) a second operation state BB: a buck-boost state corresponding to the low-level output voltage VGL;

(3) a third operation state IDLE_BST: when the clock related signal CLKD2 is at high-level and the boost state request signal BST_RQST is at low-level, it means that the system is in the idle state, so the previous operation state is maintained unchanged to reduce the power consumption;

(4) a fourth operation state IDLE BB: when the clock related signal CLKD2 is at low-level and the boost state request signal BB_RQST is at low-level, it means that the idle state is maintained, so that the previous operation state is maintained;

(5) a fifth operation state PD: it is a power down state.

As shown in the upper part of FIG. 9, during the period from the time 0 to the time T, the boost state request signal BST_RQST is at high-level for a while and the boost state request signal BB_RQST is always at low-level. Therefore, the operation state ST of the time multiplexing circuit 8 during the period from the time 0 to the time T should be the first operation state BST. The time multiplexing circuit 8 operates in the first phase (PH A) of the first operation state BST during the period in which the boost state request signal BST_RQST is at high-level. When the boost state request signal BST_RQST becomes low-level, the time multiplexing circuit 8 switches from the first phase (PH A) of the first operation state BST to the second phase (PH B) of the first operation state BST.

During the period from the time T to the time 2T, the boost state request signal BB_RQST is at high-level for a period of time and the boost state request signal BST_RQST is always at low-level. Therefore, the operation state ST of the time multiplexing circuit 8 during the period from the time T to the time 2T should be the second operation state BB. The time multiplexing circuit 8 operates in the first phase (PH A) of the first operation state BST during the period in which the boosted state request signal BB_RQST is at high-level. When the buck-boost state request signal BB_RQST becomes low-level, the time multiplexing circuit 8 switches from the first phase (PH A) of the first operation state BST to the third phase (PH C) of the first operation state BST.

During the period from the time 2T to the time 3T, the boost state request signal BST_RQST is at high-level for a period of time and the buck-boost state request signal BB_RQST is always at low-level. Therefore, the operational state ST of the time multiplexing circuit 8 during the period from the time 2T to the time 3T should be the first operation state BST. The time multiplexing circuit 8 operates in the first phase (PH A) of the first operation state BST during the period in which the boost state request signal BST_RQST is at high-level. When the boost state request signal BST_RQST becomes low-level, the time multiplexing circuit 8 switches from the first phase (PH A) of the first operational state BST to the second phase (PH B) of the first operational state BST.

During the period from the time 3T to the time 4T, the boost state request signal BST_RQST and the buck-boost state request signal BB_RQST are always at low-level, and the clock related signal CLKD2 is at low-level, it means that the system is in the buck-boost idle state during this period. Therefore, the operation state ST of the time multiplexing circuit 8 during the period from the time 3T to the time 4T should be the fourth operation state IDLE BB, so that the previous operation state is maintained unchanged during the period from the time 3T to the time 4T, that is, operating in the second phase (PH B).

During the period from the time 4T to the time 5T, the boost state request signal BST_RQST and the buck-boost state request signal BB_RQST are always at low-level, and the clock related signal CLKD2 is at high-level, it means that the system is in the boost idle state during this period. Therefore, the operation state ST of the time multiplexing circuit 8 during the period from the time 4T to the time 5T should be the third operation state IDLE_BST, so that the previous operation state is maintained during the period from the time 4T to the time 5T, that is, operating in the second phase (PH B).

During the period from the time 5T to the time 6T, the buck-boost state request signal BB_RQST is at high-level for a period of time and the boost state request signal BST_RQST is always at low-level. Therefore, the operating state ST of the time multiplexing circuit 8 should be the second operation state BB during this period from the time 5T to the time 6T. The time multiplexing circuit 8 operates in the first phase (PH A) of the first operation state BST during the period in which the boosted state request signal BB_RQST is at high-level. When the buck-boost state request signal BB_RQST becomes low-level, the time multiplexing circuit 8 switches from the first phase (PH A) of the first operation state BST to the third phase (PH C) of the first operation state BST.

During the period from the time 6T to the time 7T, the boost state request signal BST_RQST and the buck-boost state request signal BB_RQST are always at low-level, and the clock related signal CLKD2 is at high-level, it means that the system is in the boost idle state during this period. Therefore, the operation state ST of the time multiplexing circuit 8 during the period from the time 6T to the time 7T should be the third operation state IDLE_BST, so that the previous operation state is maintained during the period from the time 6T to the time 7T, that is, operating in the third phase (PH C).

During the period from the time 7T to the time 8T, the boost state request signal BST_RQST and the buck-boost state request signal BB_RQST are always at low-level, and the clock related signal CLKD2 is at low-level, it means that the system is in the boost idle during this period. Therefore, the operation state ST of the time multiplexing circuit 8 during the period from the time 7T to the time 8T should be the fourth operation state IDLE_BB, so that the previous operation state is maintained unchanged during the period from the time 7T to the time 8T, that is, operating in the third phase (PH C).

During the period from the time 8T to the time 9T, the boost state request signal BST_RQST is at high-level for a period of time and the buck-boost state request signal BB_RQST is always at low-level. Therefore, the operation state ST of the time multiplexing circuit 8 during the period from the time 8T to the time 9T should be the first operation state BST. The time multiplexing circuit 8 operates in the first phase (PH A) of the first operation state BST during the period in which the boost state request signal BST_RQST is at high-level. When the boost state request signal BST_RQST becomes low-level, the time multiplexing circuit 8 switches from the first phase (PH A) of the first operational state BST to the second phase (PH B) of the first operational state BST.

However, at the time 8T', the enable signal EN, which has been maintained at high-level, suddenly becomes low-level, and therefore, during the period from the time 8T' to the time 9T, the time multiplexing circuit 8 operates in the fifth operation state. PD, that is, the power down state.

Next, please refer to FIG. 10. FIG. 10 shows a timing diagram of the signals when the time multiplexing circuit 8 is operated in different operation states.

As shown in FIG. 10, in this embodiment, when the time multiplexing circuit 8 operates in the third operation state IDLE_BST or the fourth operation state IDLE_BB, the switch control signals VGP and VGN both stop operation, and the time multiplexing circuit 8 maintains operation in the previous phase, thereby reducing unnecessary power consumption.

The first time multiplex output signal NCTR_TMUX outputted by the first D-type flip-flop DFF1 can be triggered by the back-porch of the boost state request signal BST_RQST to become high-level; when the buck-boost state request signal BB_RQST is at high-level, the first time multiplex output signal NCTR_TMUX will be reset to low-level. The second time multiplex output signal PCTR_TMUX outputted by the second D-type flip-flop DFF2 can be triggered by the back-porch of the buck-boost state request signal BB_RQST to become low-level; when the boost state request signal BST_RQST is at high-level, the second time multiplex output signal PCTR_TMUX will be reset to high-level.

In addition, it should be noted that the second time multiplex output signal PCTR_TMUX2 outputted by the NAND gate NAND1 can be the first time multiplex output signal NCTR_TMUX or the buck-boost state request signal BB_RQST. For example, as shown in FIG. 10, another second time multiplex output signal PCTR_TMUX2 is consistent with the first time multiplex output signal NCTR_TMUX for most of the time, only when the second operation state BB is to be entered (circled by dotted line in FIG. 10), another second time multiplex output signal PCTR_TMUX2 is consistent with the buck-boost state request signal BB_RQST.

Next, please refer to FIG. 11. FIG. 11 shows a timing diagram of the signals when the time multiplexing circuit 8 is operated in different operation states.

As shown in FIG. 11, in this embodiment, when the time multiplexing circuit 8 operates in the third operation state IDLE_BST or the fourth operation state IDLE_BB, the switch control signals VGP and VGN will both stop operations, so that the time multiplexing circuit 8 will maintain operation in the previous phase, thereby reducing unnecessary power consumption.

The first time multiplex output signal NCTR_TMUX outputted by the first D-type flip-flop DFF1 can be triggered by the back-porch of the boost state request signal BST_RQST to become high-level; when the buck-boost state request signal BB_RQST is at high-level, the first time multiplex output signal NCTR_TMUX will be reset to low-level. The second time multiplex output signal PCTR_TMUX outputted by the second D-type flip-flop DFF2 can be triggered by the back-porch of the buck-boost state request signal BB_RQST to become low-level; when the boost state request signal BST_RQST is at high-level, the second time multiplex output signal PCTR_TMUX will be reset to high-level.

In addition, it should be noted that another first time multiplex output signal NCTR_TMUX2 outputted by the third NOR gate NOR3 can be the first time multiplex output signal NCTR_TMUX or the difference between the first time multiplex output signal NCTR_TMUX and the boost state request signals BST_RQST. For example, as shown in FIG. 11, another first time multiplex output signal NCTR_TMUX2 is consistent with the first time multiplex output signal NCTR_TMUX for most of the time, only when the first operation state BST is to be entered (circled by dotted line in FIG. 11), another first time multiplex output signal NCTR_TMUX2 will be equal to the first time multiplex output signal NCTR_TMUX minus the boost state request signal BST_RQST.

Compared to the prior art, the time multiplexing circuit applied to the DC-DC converting system proposed by the invention maintains the operation in the previous phase in the boost idle state or the buck-boost idle state, so as to avoid a change of the switch control signal in the boost idle state or the buck-boost idle state, so that unnecessary power consumption can be omitted, and a good power saving effect can be achieved, which can be applied to the power management of the display driver in the display.

With the example and explanations above, the features and spirits of the invention will be hopefully well described. Those skilled in the art will readily observe that numerous modifications and alterations of the device may be made while retaining the teaching of the invention. Accordingly, the above disclosure should be construed as limited only by the metes and bounds of the appended claims.

What is claimed is:

1. A time multiplexing circuit, applied to a DC-DC converting system and use for receiving a first pulse-width modulation signal and a second pulse-width modulation signal and outputting a first reverse output signal and a second reverse output signal, the time multiplexing circuit comprising:
   a first NOR gate, configured to receive the first pulse-width modulation signal, a clock signal and a reverse clock related signal and output a boost state request signal;
   a second NOR gate, configured to receive the second pulse-width modulation signal, the clock signal and a clock related signal and output a buck-boost state request signal;
   a first inverter, coupled to the first NOR gate and configured to convert the boost state request signal into a reverse boost state request signal;
   a second inverter, coupled to the second NOR gate and configured to convert the buck-boost state request signal into a reverse buck-boost state request signal;
   a first D-type flip-flop, coupled to the first inverter and configured to receive the reverse boost state request signal and an input voltage and output a first time multiplex output signal and a first reverse time multiplex output signal respectively;
   a second D-type flip-flop, coupled to the second inverter and configured to receive the reverse buck-boost state request signal and the input voltage and output a second time multiplex output signal and a second reverse time multiplex output signal respectively;
   a third NOR gate, coupled to the first D-type flip-flop and configured to receive the first reverse time multiplex output signal and the boost state request signal and output another first time multiplex output signal;
   a NOR gate, coupled to the second D-type flip-flop and configured to receive the second reverse time multiplex output signal and the reverse buck-boost state request signal and output another second time multiplex output signal;
   an OR gate, coupled to the third NOR gate and configured to receive the another first time multiplex output signal and a reverse enable signal and output the first reverse output signal; and
   an AND gate, coupled to the NOR gate and configured to receive the another second time multiplex output signal and an enable signal and output the second reverse output signal.

2. The time multiplexing circuit of claim 1, wherein the DC-DC converting system is a single-inductor dual-output (SIDO) DC-DC converting system used for outputting a high-level output voltage and a low-level output voltage, wherein the high-level output voltage is a positive voltage and the low-level output voltage is a negative voltage.

3. The time multiplexing circuit of claim 1, wherein the first time multiplex output signal outputted by the first D-type flip-flop is triggered by a back-porch of the boost state request signal to become high-level; when the enable signal is at low-level or the buck-boost state request signal is at high-level, the first time multiplex output signal is reset to low-level.

4. The time multiplexing circuit of claim 1, wherein the second time multiplex output signal outputted by the second D-type flip-flop is triggered by a back-porch of the buck-boost state request signal to become low-level; when the enable signal is at low-level or the boost state request signal is at high-level, the second time multiplex output signal is reset to high-level.

5. The time multiplexing circuit of claim 1, wherein the another first time multiplex output signal outputted by the third NOR gate is the first time multiplex output signal or a difference between the first time multiplex output signal and the boost state request signal.

6. The time multiplexing circuit of claim 1, wherein the another second time multiplex output signal outputted by the NAND gate is the first time multiplex output signal or the boost state request signal.

7. The time multiplexing circuit of claim 1, wherein the clock related signal is half of the clock signal.

8. The time multiplexing circuit of claim 1, wherein the reverse clock related signal is half of a reverse signal of the clock signal.

9. The time multiplexing circuit of claim 1, wherein the reverse enable signal is a reverse signal of the enable signal.

10. The time multiplexing circuit of claim 2, wherein the DC-DC converting system further comprises a single-inductor dual-output DC-DC converter, and the time multiplexing circuit is coupled to the single-inductor dual-output DC-DC converter through two inverters.

11. The time multiplexing circuit of claim 2, wherein when the boost state request signal is at high-level, the high-level output voltage does not reach a default value, and the DC-DC converting system enters into a first phase of a boost state.

12. The time multiplexing circuit of claim 2, wherein when the buck-boost state request signal is at high-level, the low-level output voltage does not reach a default value, and the DC-DC converting system enters into a first phase of a buck-boost state.

13. The time multiplexing circuit of claim 2, wherein the time multiplexing circuit has five operation states comprising:
   a first operation state being a boost state corresponding to the high-level output voltage;
   a second operation state being a buck-boost state corresponding to the low-level output voltage;
   a third operation state maintaining a previous operation state when the clock related signal is at high-level and the boost state request signal is at low-level;
   a fourth operation state maintaining the previous operation state when the clock related signal is at low-level and the buck-boost state request signal is at low-level; and
   a fifth operation state being a power down state.

14. The time multiplexing circuit of claim 10, wherein the two inverters convert the first reverse output signal and the second reverse output signal outputted by the time multiplexing circuit into a first switch control signal and a second switch control signal and output the first switch control signal and the second switch control signal to the single-inductor dual-output DC-DC converter.

15. The time multiplexing circuit of claim 14, wherein the single-inductor dual-output DC-DC converter comprises a N-type transistor, a P-type transistor and an inductor, the P-type transistor is coupled between the input voltage and the inductor and the N-type transistor is coupled between the inductor and ground; a gate of the N-type transistor is controlled is controlled by the first switch control signal and a gate of the P-type transistor is controlled by the second switch control signal.

* * * * *